(12) United States Patent
Ohashi et al.

(10) Patent No.: US 7,980,731 B2
(45) Date of Patent: Jul. 19, 2011

(54) LIGHT-EMITTING ELEMENT MOUNTING SUBSTRATE, LIGHT SOURCE, LIGHTING DEVICE, DISPLAY DEVICE, TRAFFIC SIGNAL, AND METHOD OF MANUFACTURING LIGHT-EMITTING ELEMENT MOUNTING SUBSTRATE

(75) Inventors: Masakazu Ohashi, Sakura (JP); Ken-ichi Uruga, Tokyo (JP); Masanori Ito, Tokyo (JP)

(73) Assignee: Fujikura Ltd., Tokyo (JP)

( * ) Notice: Subject to any disclaimer, the term of this patent is extended or adjusted under 35 U.S.C. 154(b) by 137 days.

(21) Appl. No.: 12/325,085

(22) Filed: Nov. 28, 2008

(65) Prior Publication Data

US 2009/0168432 A1    Jul. 2, 2009

Related U.S. Application Data

(63) Continuation of application No. PCT/JP2006/310752, filed on May 30, 2006.

(51) Int. Cl.
*F21V 7/00* (2006.01)

(52) U.S. Cl. ......... 362/296.04; 362/296.07; 362/311.02; 362/311.15

(58) Field of Classification Search ............. 362/296.01, 362/296.02, 296.04, 296.05, 296.07, 311.02, 362/311.04, 311.05, 311.1, 311.14, 311.15, 362/341; 257/98, 99, 100
See application file for complete search history.

(56) References Cited

U.S. PATENT DOCUMENTS

| | | | |
|---|---|---|---|
| 4,734,316 A | 3/1988 | Hees et al. | |
| 5,851,449 A | 12/1998 | Uchino et al. | |
| 6,610,563 B1 * | 8/2003 | Waitl et al. | 257/98 |
| 6,765,801 B1 | 7/2004 | Glenn et al. | |
| 6,850,001 B2 * | 2/2005 | Takekuma | 362/311.02 |
| 7,473,933 B2 * | 1/2009 | Yan | 257/100 |
| 2003/0193055 A1 * | 10/2003 | Martter et al. | 257/98 |
| 2005/0073840 A1 | 4/2005 | Chou et al. | |
| 2005/0077616 A1 | 4/2005 | Ng et al. | |
| 2005/0093178 A1 | 5/2005 | Huang et al. | |
| 2005/0122018 A1 | 6/2005 | Morris | |
| 2006/0097385 A1 | 5/2006 | Negley et al. | |

FOREIGN PATENT DOCUMENTS

| | | | |
|---|---|---|---|
| JP | 62-84942 U | | 5/1987 |
| JP | 6-5905 A | | 1/1994 |
| JP | 9-027643 A | | 1/1997 |
| JP | 9-153646 A | | 6/1997 |
| JP | 2000-40213 A | | 2/2000 |
| JP | 2000-288638 A | | 10/2000 |
| JP | 2002-009349 A | | 1/2002 |
| JP | 2003-124438 A | | 4/2003 |
| JP | 2003-282948 A | | 10/2003 |
| JP | 2003-283034 A | | 10/2003 |
| JP | 2004-291009 A | | 10/2004 |
| JP | 2005175048 A | * | 6/2005 |
| JP | 2005-209763 A | | 8/2005 |
| KR | 10-2005-0054813 A | | 6/2005 |

OTHER PUBLICATIONS

International Search Report dated Aug. 15, 2006.
Supplementary European Search Report, Dec. 10, 2010.

* cited by examiner

*Primary Examiner* — Y My Quach Lee
(74) *Attorney, Agent, or Firm* — Sughrue Mion, PLLC

(57) ABSTRACT

A light-emitting element mounting substrate (20) in which a surface of a core metal (21) is coated with an enamel layer (22), and a reflective concave portion (23) for mounting a light-emitting element is provided, wherein a groove (24) is provided around the reflective concave portion.

11 Claims, 4 Drawing Sheets

LIGHT-EMITTING ELEMENT MOUNTING SUBSTRATE, LIGHT SOURCE, LIGHTING DEVICE, DISPLAY DEVICE, TRAFFIC SIGNAL, AND METHOD OF MANUFACTURING LIGHT-EMITTING ELEMENT MOUNTING SUBSTRATE

TECHNICAL FIELD

The present invention relates to a light-emitting element mounting substrate for mounting a light-emitting element such as a light-emitting diode (hereinbelow referred to as an LED) and a method of manufacture thereof, a light source that includes a light-emitting element mounted on the substrate, a lighting device that is provided with the light sources a display device, and a traffic signal.

Priority is claimed on Japanese Patent Application No. 2005-126243, filed Apr. 25, 2005, the content of which is incorporated herein by reference.

BACKGROUND ART

A light-emitting element is normally mounted on a substrate and moreover packaged by sealing the light-emitting element with a transparent resin in order to protect it from the external environment such as external forces and humidity and the like. In addition, a convex part of a lens is sometimes formed on the upper portion of the sealing resin in order to perform control such as converging and diffusing of light that is emitted from the light-emitting element. To form such a lens shape, for example, the resin is raised by surface tension prior to curing and subjected to heat curing or ultraviolet curing while maintaining that shape, whereby it is possible to finish the upper portion of the sealing resin in a lens shape (for example, refer to Patent Document 1).

In the method of manufacturing this kind of lens shape, the amount of raising of the resin to be raised is significantly affected by the wettability of the substrate and resin. For example, due to variations in the surface condition of the substrate and the like, when the coating amount of the sealing resin is excessive or the wettability of the substrate surface is high, the resin may flow out on the upper surface of the substrate prior to curing. Removing his resin takes time and effort, and sometimes the resin that has flowed out may cover electrodes that are provided on the substrate side face. In the case of attempting to anchor the substrate by soldering, the resin that has become attached to the electrodes may act as an electrical insulating film, leading to the problem of poor electrical conduction.

In recent years, the application of LEDs has advanced to lighting uses and traffic signals, and further improvements in luminescence intensity are demanded. By increasing the amount of electrical current that is impressed, it is possible to increase the luminescence intensity of an LED. However, in this case, it is necessary for the light-emitting element to efficiently dissipate the heat because the light-emitting element accompanies the heat generation simultaneously. In the case of the heat dissipation being insufficient, the light-emitting element reaches a high temperature when lit. As a result, the light-emitting efficiency falls and so the target luminescence intensity is no longer obtained. Also, when used over a long period, the reliability of the LED falls, and the possibility of malfunction such as non-lighting increases.

In addition, in order to efficiently emit the light forward that is radiated from the light-emitting element, it is preferable to provide a reflective concave portion as shown in FIG. 4. The package structure of the light-emitting element shown in FIG. 4 uses a package 1 that has a reflective concave portion 2 with a mortar-like shape, electrodes 3 of which a portion thereof extends into the reflective concave portion 2, and a light-emitting element 4 such as an LED mounted on one electrode 3 in the reflective concave portion 2 of this package 1. The light-emitting element 4 and the other electrode 3 are electrically connected by a gold wire 5, and a sealing resin 6 is filled in the reflective concave portion 2 so that the upper portion rises upward, and then cured so as to form a lens shape. In the light source of this package structure, the light-emitting element 4 is lit up by electrical conduction between the electrodes 3, and a portion of the light that is generated from the light-emitting element 4 is directly emitted while the other portion is emitted by being reflected by the reflective concave portion 4. Therefore, it is possible to efficiently emit the light that is generated from the light-emitting element 4 to the front of the package.

Patent Document 1: Japanese Unexamined Patent Application, First Publication No. H09-153646

DISCLOSURE OF THE INVENTION

Problems to be Solved by the Invention

An enamel substrate 9 as shown in FIG. 5 has been conceived as a substrate with favorable heat dissipation.

This enamel substrate 9 is constituted by covering the surface of a core metal 7 in which a reflective concave portion 11 with a mortar-like shape is formed with a thin enamel layer 8 consisting of glass or the like. On the enamel layer 8, electrodes 10 are provided so that portions thereof extend into the reflective concave portion 11.

In the enamel substrate 9 that has the reflective concave portion 11 as shown in FIG. 5, it is necessary to process the core metal layer 7 so as to have the reflective concave portion 11. Processing methods include machining with a drill and a drawing process with a metal press, with a pressing process being desirable from the standpoint of productivity and processing cost.

However, in the case of performing a drawing process with a metal press, when no particular consideration is given to the shape of the core metal, the overall substrate shape warps or bulges and projections occur due to local escape of the metal as a result of the pressing pressure of the metal press. Post processing is then required in order to correct these issues, leading to a worsening of production efficiency. FIG. 6B and FIG. 6C are drawings that show examples of a bulge and projections that frequently occur in the drawing processing of the core metal. FIG. 6A is a cross-sectional view of the core metal 7 which should be manufactured. FIG. 6B is a cross-sectional view showing the case of a bulge 12 occurring on the undersurface side of the reflective concave portion 11, and FIG. 6C is a cross-sectional view showing the case of projections 13 occurring due to the swelling of the peripheral edges of the reflective concave portion 11. Correcting the occurrences of this bulge 12 and projections 13 by grinding and the like requires much effort and time.

The present invention was achieved in view of the above circumstances, and has as its object to provide a light-emitting element mounting substrate that is provided with an enamel substrate with a reflective concave portion that enables the manufacture of an enamel substrate having a reflective concave portion efficiently and at low cost, a light source that is provided with a light-emitting element mounted on the substrate, a lighting device that is provided with the light source, a display device, a traffic signal, and a method of manufacturing a light-emitting element mounting substrate.

In order to achieve the object, the present invention provides a light-emitting element mounting substrate including a core metal, an enamel layer that is coated on the surface of the core metal, a reflective concave portion for mounting a light-emitting element, and a groove that is formed around the reflective concave portion.

Also, the present invention provides a light source that is provided with the abovementioned light-emitting element mounting substrate and a light-emitting element that is mounted in the reflective concave portion.

In the light source of the present invention, it is preferable that the reflective concave portion is sealed in resin, and the upper portion of the sealing resin projects out in a lens shape.

Also, the present invention provides a lighting device that has the light source according to the abovementioned invention.

Also, the present invention provides a display device that has the light source according to the abovementioned invention.

Also, the present invention provides a traffic signal that has the light source according to the abovementioned invention.

Also, the present invention provides a method of manufacturing a light-emitting element mounting substrate, the method including: a step of forming a groove in a metal sheet for manufacturing a core metal; a step of applying a machining process to the metal sheet to form a reflective concave portion for mounting a light-emitting element in a position that is separated from the groove; and a step of forming an enamel layer that is coated on the surface of a core metal that is manufactured by forming a groove and a reflective concave portion in the metal sheet.

EFFECTS OF THE INVENTION

Since the light-emitting element mounting substrate of the present invention uses an enamel substrate in which a groove is formed around a reflective concave portion in which a light-emitting element is mounted, when a core metal is manufactured by a drawing process with a metal press, it is possible to form the reflective concave portion without the core metal warping or deforming, and there is no need to perform post processing in order to correct such deformation or the like, and so it is possible to manufacture the substrate efficiently and at low cost.

Also, since the groove has been formed around the reflective concave portion, even in the case of an excessive amount of the sealing resin being applied, the resin does not flow to the outside of the substrate, and so it is possible to prevent problems such as an electrical insulating film being formed on the surface of the electrodes by the resin that has flown out.

Also, by adopting a structure that mounts the light-emitting element on an enamel substrate whose core is metal, the heat dissipation becomes preferable, and in the case of mounting a plurality of light-emitting elements, when the electrical power that is distributed to each light-emitting element is increased, it is possible to prevent a decrease in luminescence efficiency due to a temperature increase, and so it is possible to increase the luminescence intensity with expectations.

DESCRIPTION OF REFERENCE NUMERALS

20 light-emitting element mounting substrate; 21 core metal; 22 enamel layer; 23 reflective concave portion; 24 groove; 25 bottom surface; 26 tapered surface; 27 electrodes; 28 light source; 29 light-emitting element; 30 gold wire; 31 sealing resin

BEST MODE FOR CARRYING OUT THE INVENTION

The embodiments of the present invention shall be described hereinbelow with reference to the drawings.

Figure 1A:
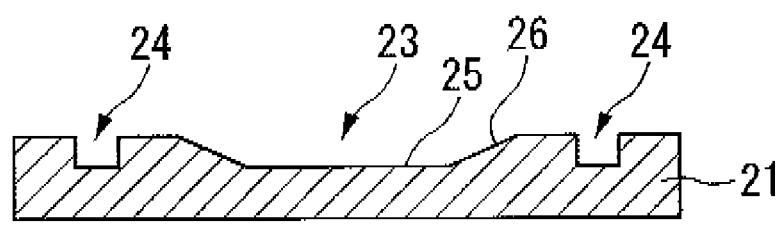
FIG. 1A is a cross-sectional view of the core metal, being an example of the core metal that is used in the light-emitting element mounting substrate of the present invention.
Figure 1B:
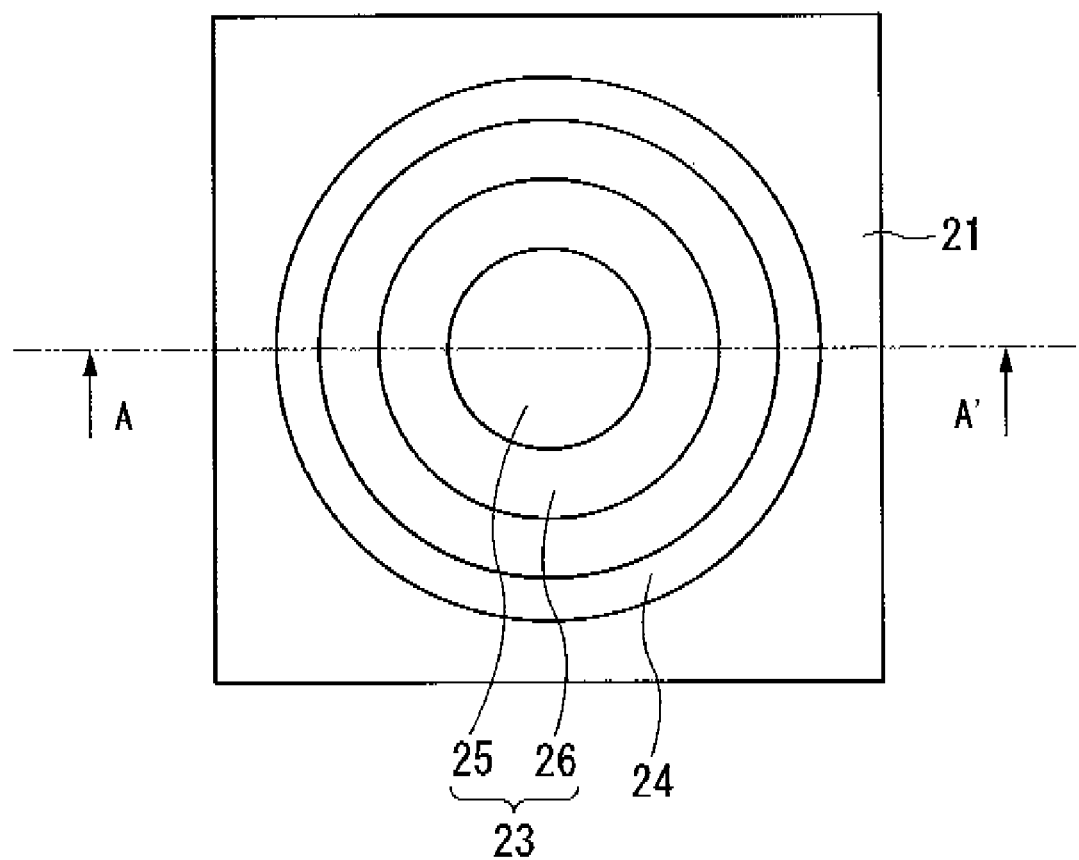
FIG. 1B is a plan view of the core metal, being an example of the core metal that is used in the light-emitting element mounting substrate of the present invention.
Figure 2:
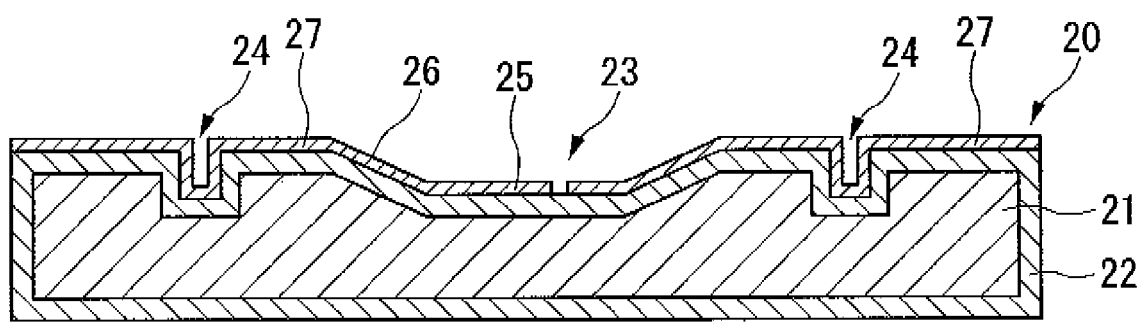
FIG. 2 is a cross-sectional view that shows an example of the light-emitting element mounting substrate of the present invention.
Figure 3:
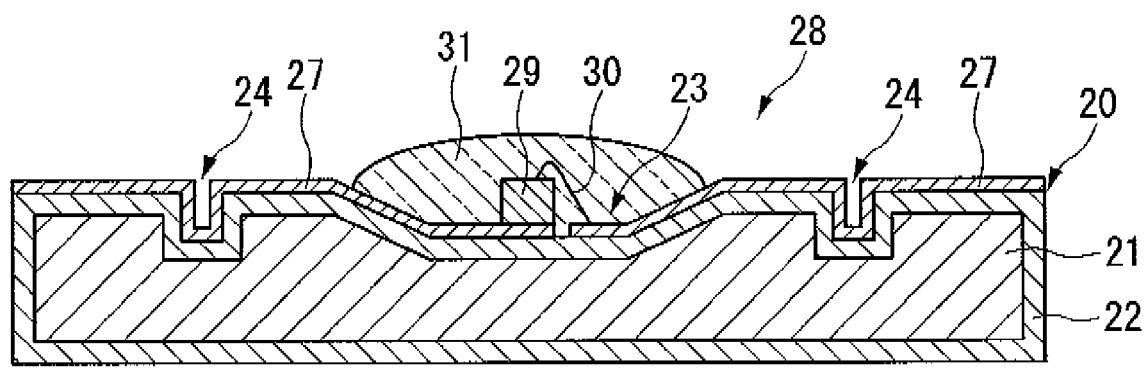
FIG. 3 is a cross-sectional view that shows an example of the light source of the present invention.
Figure 4:
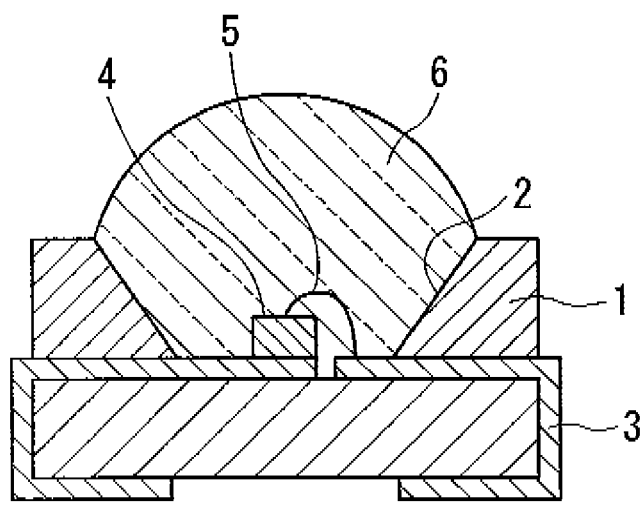
FIG. 4 is a cross-sectional view that shows the package structure of a conventional light-emitting element.
Figure 5:
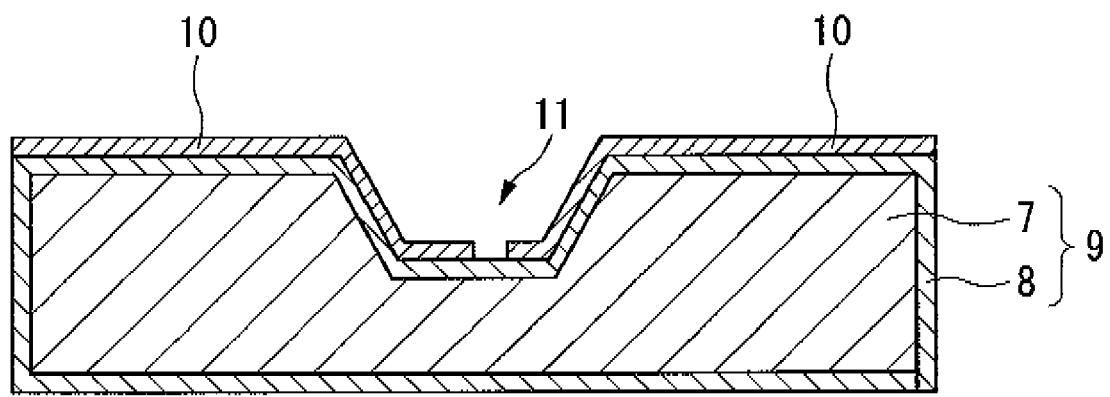
FIG. 5 is a cross-sectional view that shows an example of an enamel substrate.
Figure 6A:
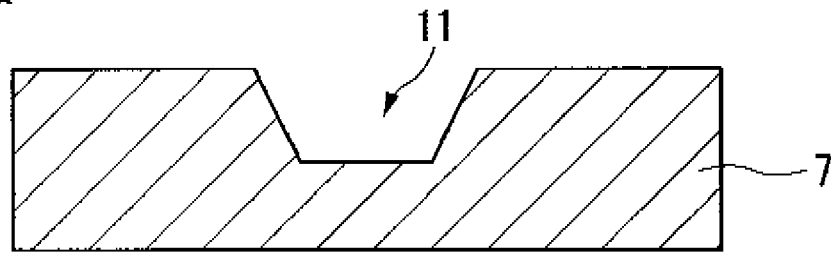
FIG. 6A is a cross-sectional view that shows a core metal that is manufactured in a suitable state.
Figure 6B:
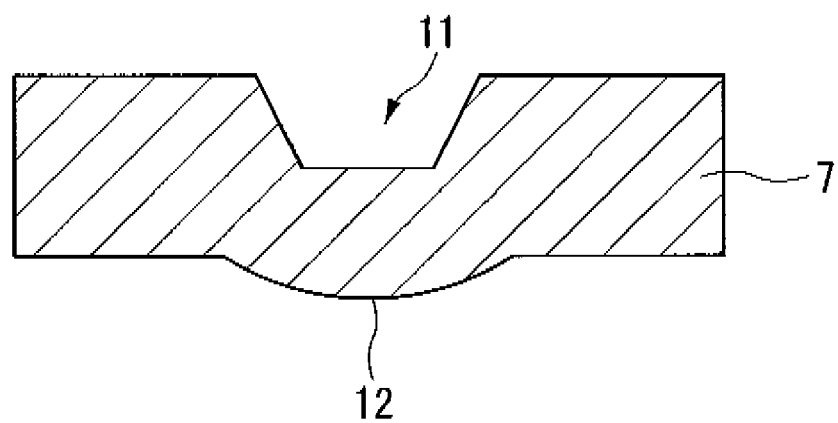
FIG. 6B is a cross-sectional view that shows an example of a bulge occurring during processing of the core metal.
Figure 6C:
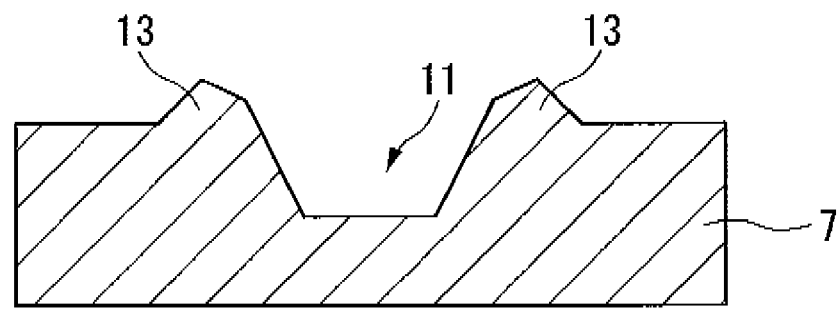
FIG. 6C is a cross-sectional view that shows an example of projections occurring during processing of the core metal.

FIG. 1A to FIG. 3 show one embodiment of the present invention. FIG. 1A and FIG. 1B show one example of a core metal 21 that is used in the light-emitting element mounting substrate of the present invention. FIG. 1A is a side view of the core metal 21, while FIG. 1B is a plan view thereof. FIG. 2 is a cross-sectional view that shows an example of a light-emitting element mounting substrate 20 of the present invention. Also, FIG. 3 is a cross-sectional view that shows an example of a light source 28 of the present invention that is constituted by mounting a light-emitting element 29 on the light-emitting element mounting substrate 20 show in FIG. 2.

An enamel substrate serves as a main body, formed by coating an enamel layer 22 on the surface of the core metal 21 shown in FIG. 1 in which a reflective concave portion 23 that serves as the mounting position of the light-emitting element 29 and a groove 24 that surrounds the reflective concave portion 23 are provided on one side surface, and on the one side surface of this enamel substrate a pair of electrodes 27 are provided with a portion thereof extending into the reflective concave portion 23.

The reflective concave portion 23 that is formed in his light-emitting element mounting substrate 20 has a mortar-like shape, and has a flat bottom surface 25 on which the light-emitting element 29 is mounted and a tapered surface 26 on the periphery thereof.

Also, the groove 24 that is provided around the reflective concave portion 23 is provided in a concentric circular manner around the reflective concave portion 23 in the present illustration.

It is preferable that the material of the core metal 21 is a metal that has good thermal conductivity and enables the enamel layer 22 to be firmly baked on, with a low-carbon steel sheet being desirable.

Also, it is preferable that the material of the enamel layer 22 is a material that can be thinly baked onto the surface of the core metal 21 and provides sufficient electrical insulation, with, for example, glass or the like being desirable.

The light source 28 shown in FIG. 3 is constituted by using the light-emitting element mounting substrate 20 described above to mount the light-emitting element 29 by die bonding or the like on one electrode 27 that is extended onto the bottom surface 25 of the reflective concave portion 23, connecting the light-emitting element 29 and the other electrode 27 with a gold wire 30, and moreover sealing the inside of the reflective concave portion 23 with a sealing resin 31 with the upper portion thereof rising.

The light-emitting element 29 may be a blue light-emitting element or a green light-emitting element such as a nitride compound semiconductor, or a red or infrared light-emitting element such as GaP. Also, a white LED may be obtained by mounting a blue light-emitting element such as a nitride compound semiconductor and dispersing in the sealing resin 31 yellow emission phosphor which is excited with blue light such as an yttrium-aluminum-garnet fluorescent material that is obtained by activating cerium.

Next, the method of manufacturing this light-emitting element mounting substrate 20 shall be described.

First, the groove 24 is formed around the formation position of the reflective concave portion 23 on a metal sheet that will serve as the core metal 21. This groove 24 can be formed by drilling or the like.

Next, a draw process using a metal press is performed on the metal sheet, and by forming the reflective concave portion 23, the core metal 21 with the shape shown in FIG. 1 is manufactured.

By providing the groove 24 around the formation position of the reflective concave portion 23 in advance, when forming the reflective concave portion 23 in a metal sheet by a drawing process with a metal press, the stress that occurs when fabricating the reflective concave portion 23 with pushing pressure is generated in the direction of the groove 24, and so warping of the metal sheet as a whole or bulging of a portion of the metal sheet is prevented.

Also, by providing sufficient width to the groove 24, the groove 24 has a certain width even after the metal escape following the drawing process. The enameling process is performed on the substrate surface in the state of this groove 24 remaining, and when manufacturing the light source 28 using the light-emitting element mounting substrate 20 by forming the electrodes, even when the sealing resin 31 flows out from the reflective concave portion 23, it is stopped by the groove 24 to prevent the resin from flowing out to other portions.

Next, glass is baked onto the surface of the core metal 1, and an enamel substrate is produced by coating the surface of the core metal 21 with the enamel layer 22. Methods of forming the enamel layer 22 include, for example, dispersing glass powder in a suitable dispersion medium such as 2-propanol, placing the core metal 21 in the dispersion medium, inserting an electrode to serve as a counter electrode in the dispersion medium, and passing electricity between the core metal 21 and the counter electrode, whereby the glass powder is electrodeposited on the surface of the core metal 21. Thereafter, following the electrodeposition of glass the core metal 21 is raised up, dried, and placed in a high-temperature baking furnace to be heated. By baking on the glass, it is possible to form an enamel layer 22 with an accurate and uniform thinness on the surface of the core metal 21. Moreover, in order to firmly coat the enamel layer 22, it is possible to perform an oxidation treatment on the surface of the core metal 21.

Next, the pair of electrodes 27 is formed for supplying electricity to the light-emitting element 29 on the surface of the enamel substrate that was produced in the above manner. It is preferable to form this pair of electrodes 27 by coating a silver paste or copper paste along a pattern of which a portion extends into the reflective concave portion 23 and then baking it on. Thereby, the light-emitting element mounting substrate 20 as shown in FIG. 2 is manufactured.

Next, the light-emitting element 29 is die-bonded on the one electrode 27 in the reflective concave portion 23 with a silver paste, and moreover wire bonding is performed to connect the light-emitting element 29 and the other electrode 27 with the gold wire 30. Then, a sealing resin, such as a thermosetting epoxy resin, is injected in the reflective concave portion 23 until the upper portion sufficiently rises upward with surface tension, and then cured while maintaining that shape to form the sealing resin 31 having a lens shape. Thereby, the light source 28 as show in FIG. 3 is formed.

Since the light-emitting element mounting substrate 20 of the present embodiment uses an enamel substrate in which the groove 24 is formed around the reflective concave portion 23 in which the light-emitting element 29 is mounted, when manufacturing the core metal 21 by a drawing process with a metal press, it is possible to form the reflective concave portion 23 without the core metal 21 warping or deforming, and there is no need to perform post processing in order to correct such deformation or the like, and so it is possible to manufacture the substrate efficiently and at low cost.

Also, since the groove 24 has been formed around the reflective concave portion 23, even in the case of an excessive amount of the sealing resin 31 being applied, the resin does not flow to the outside of the substrate, and so it is possible to prevent problems such as an electrical insulating film being formed on the surface of the electrodes by the resin that has flown out.

Also, by adopting a structure that mounts the light-emitting element 29 on an enamel substrate whose core is metal, the heat dissipation is good, and in the case of mounting a plurality of light-emitting elements, when the electrical power that is distributed to each light-emitting element is increased, it is possible to prevent a decrease in luminescence efficiency due to a temperature increase, and so it is possible to increase the luminescence intensity in line with expectations.

Note that in the example described above, the description was premised on a metal press (drawing process), but even in the case of forming a reflective concave portion in the core metal by another machining method such as drilling, by providing the groove around the reflective concave portion, it goes without saying that there is the effect of preventing flow out of the resin in the case of forming the lens body with sealing resin.

Also, in the foregoing example, the case was described of manufacturing one reflective concave portion in the enamel substrate, but it is also possible to provide a plurality of reflective concave portions each having a surrounding groove on the enamel substrate.

Embodiment

The substrate was manufactured by drilling a circular groove in the circumferential edge of the position where a reflective concave portion is to be formed by a drawing process with a metal press in a low-carbon steel sheet with a thickness of 1.5 mm. Processing was performed to achieve dimensions of an inner circumferential diameter of 10 mm an outer circumferential diameter of 12 mm, and a depth of 0.5 mm. Then, punching of a metal sheet and forming of the reflective concave portion were performed with a metal press so as to achieve the shape as shown in FIG. 1. The size of the core metal is 15 mm×15 mm, and the reflective concave portion was fabricated to have a depth of 0.6 mm, bottom surface diameter of 2.1 mm, and an inclining angle of 45° at the tapered surface. As a result, dimensions nearly as in line with the design were obtained for the reflective concave portion, and it was confirmed that the width of the groove decreased from the original 2 by on average about 0.8 mm.

INDUSTRIAL APPLICABILITY

As an example of practical application of the present invention, application to a light-emitting element mounting substrate for mounting a light-emitting element such as an LED or the like is preferred.

The invention claimed is:

1. A light-emitting element mounting substrate comprising:
   a core metal;
   an enamel layer that is coated on a surface of the core metal;
   a reflective concave portion for mounting a light-emitting element, the reflective concave portion being formed in the core metal; and
   a groove that is formed around the reflective concave portion, the groove being formed in the core metal,
   wherein all portions of the groove are disposed outside a maximum circumferential diameter of the reflective concave portion, and
   wherein the groove comprises an inner annular side surface and an outer annular side surface both of which are formed of the core metal.

2. A light source comprising the light-emitting element mounting substrate according to claim 1, and the light-emitting element that is mounted in the reflective concave portion.

3. The light source according to claim 2, wherein the reflective concave portion is sealed in a resin, and an upper portion of the sealing resin protrudes in a lens shape.

4. A light-emitting element mounting substrate according to claim 3, wherein the groove is configured to receive overflow of the sealing resin from the reflective concave portion.

5. A lighting device comprising the light source according to claim 2.

6. A display device comprising the light source according to claim 2.

7. A traffic signal that has the light source according to claim 2.

8. A light-emitting element mounting substrate according to claim 1, wherein the groove extends in the core metal at least to a depth that is approximately equal to a depth of the reflective concave portion.

9. A light-emitting element mounting substrate according to claim 1, wherein the groove is configured to absorb pushing pressure generated during formation of the reflective concave portion.

10. A light-emitting element mounting substrate according to claim 1, wherein the core metal is a drawn core metal.

11. A method of manufacturing a light-emitting element mounting substrate, the method comprising:
   forming a groove in a metal sheet for manufacturing a core metal;
   after forming the groove, applying a machining process to the metal sheet to form a reflective concave portion in the metal sheet for mounting a light-emitting element in a position that is separated from the groove such that all portions of the groove are disposed outside a maximum circumferential diameter of the reflective concave portion; and
   forming an enamel layer so as to cover a surface of the core metal that is manufactured by forming the groove and the reflective concave portion in the metal sheet.

* * * * *